(12) United States Patent
Mizushima et al.

(10) Patent No.: US 8,207,572 B2
(45) Date of Patent: Jun. 26, 2012

(54) NONVOLATILE SEMICONDUCTOR MEMORY DEVICE

(75) Inventors: Hiroaki Mizushima, Kanagawa (JP); Fumihiko Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 112 days.

(21) Appl. No.: 12/827,015

(22) Filed: Jun. 30, 2010

(65) Prior Publication Data

US 2011/0024826 A1 Feb. 3, 2011

(30) Foreign Application Priority Data

Jul. 31, 2009 (JP) ................. 2009-180026

(51) Int. Cl.
 *H01L 29/792* (2006.01)
(52) U.S. Cl. ........ 257/326; 257/314; 257/316; 257/324; 257/E21.423
(58) Field of Classification Search .......... 257/185, 257/314–316, 324–326; 365/63, 185; 438/257–258; 428/593
See application file for complete search history.

(56) References Cited

U.S. PATENT DOCUMENTS 6,984,567 B2 * 1/2006 Kobayashi ............ 438/340

FOREIGN PATENT DOCUMENTS

JP 4-79369 3/1992

* cited by examiner

*Primary Examiner* — Dung A. Le
(74) *Attorney, Agent, or Firm* — Young & Thompson

(57) ABSTRACT

A nonvolatile semiconductor memory device includes a first columnar protrusion and a second columnar protrusion formed to be spaced out on a surface of a semiconductor substrate, and the first and the second columnar protrusions each include a split gate nonvolatile memory cell in which a first source/drain region and a second source/drain region are formed at a surrounding part and an extremity, and in which a first layered structure, in which a charge accumulating film and a memory gate line are layered, and a second layered structure, in which a gate oxide film and a control gate line are layered, are formed on a surface of a sidewall between the surrounding part and the extremity. The first layered structure is also formed between the first and second columnar protrusions, whereby the memory gate line of the first columnar protrusion and the second columnar protrusion is connected each other.

14 Claims, 8 Drawing Sheets

- 8 : SECOND SOURCE/DRAIN REGION
- 2a : COLUMNAR PROTRUSION
- 3 : FIRST SOURCE/DRAIN REGION
- 1 : SEMICONDUCTOR SUBSTRATE

- 2a : COLUMNAR PROTRUSION
- 8 : SECOND SOURCE/DRAIN REGION
- 3 : FIRST SOURCE/DRAIN REGION
- 1 : SEMICONDUCTOR SUBSTRATE

FIG. 6A

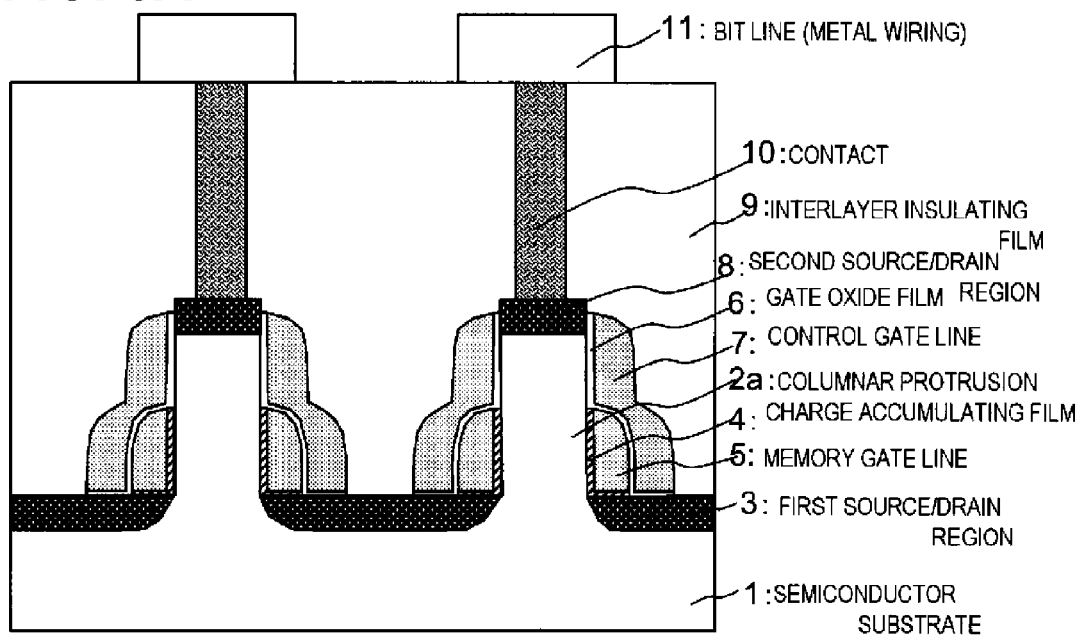

- 11: BIT LINE (METAL WIRING)
- 10: CONTACT
- 9: INTERLAYER INSULATING FILM
- 8: SECOND SOURCE/DRAIN REGION
- 6: GATE OXIDE FILM
- 7: CONTROL GATE LINE
- 2a: COLUMNAR PROTRUSION
- 4: CHARGE ACCUMULATING FILM
- 5: MEMORY GATE LINE
- 3: FIRST SOURCE/DRAIN REGION
- 1: SEMICONDUCTOR SUBSTRATE

FIG. 6B

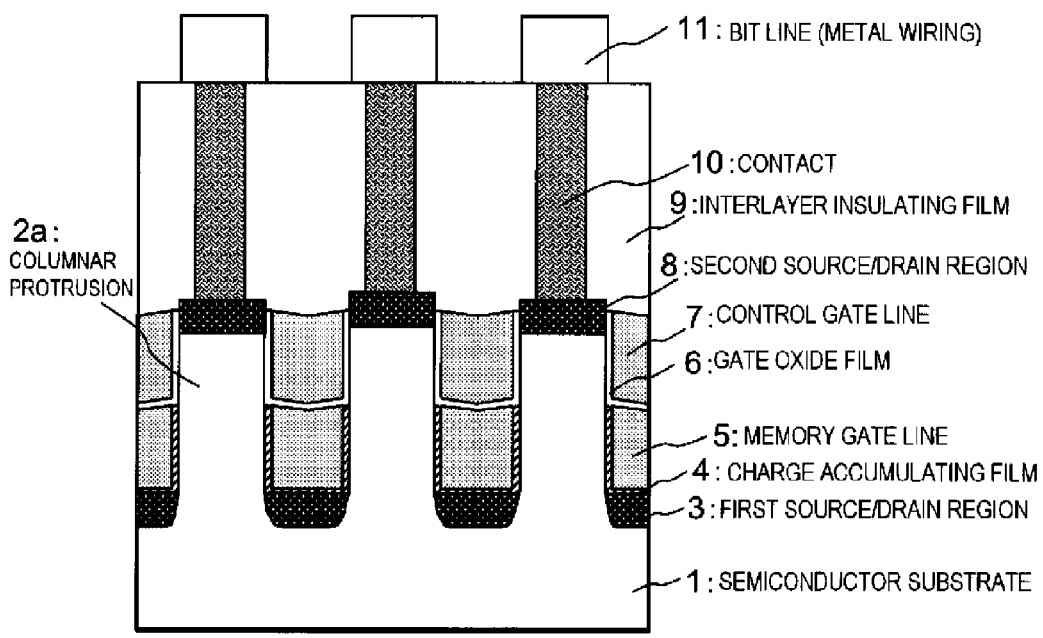

- 11: BIT LINE (METAL WIRING)
- 10: CONTACT
- 9: INTERLAYER INSULATING FILM
- 8: SECOND SOURCE/DRAIN REGION
- 2a: COLUMNAR PROTRUSION
- 7: CONTROL GATE LINE
- 6: GATE OXIDE FILM
- 5: MEMORY GATE LINE
- 4: CHARGE ACCUMULATING FILM
- 3: FIRST SOURCE/DRAIN REGION
- 1: SEMICONDUCTOR SUBSTRATE

FIG. 7A

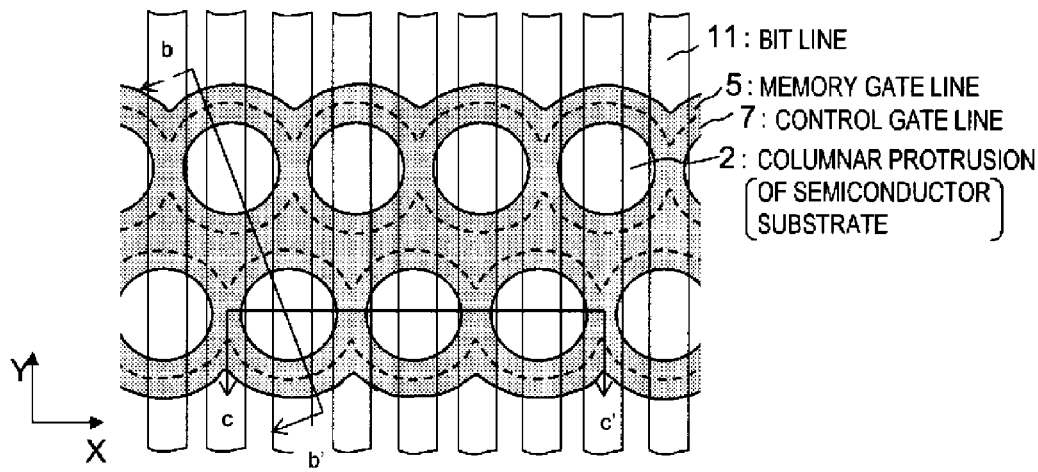

- 11: BIT LINE
- 5: MEMORY GATE LINE
- 7: CONTROL GATE LINE
- 2: COLUMNAR PROTRUSION (OF SEMICONDUCTOR SUBSTRATE)

FIG. 7B

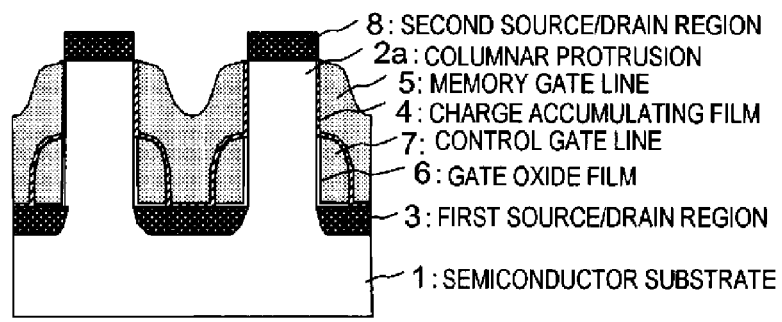

- 8: SECOND SOURCE/DRAIN REGION
- 2a: COLUMNAR PROTRUSION
- 5: MEMORY GATE LINE
- 4: CHARGE ACCUMULATING FILM
- 7: CONTROL GATE LINE
- 6: GATE OXIDE FILM
- 3: FIRST SOURCE/DRAIN REGION
- 1: SEMICONDUCTOR SUBSTRATE

FIG. 7C

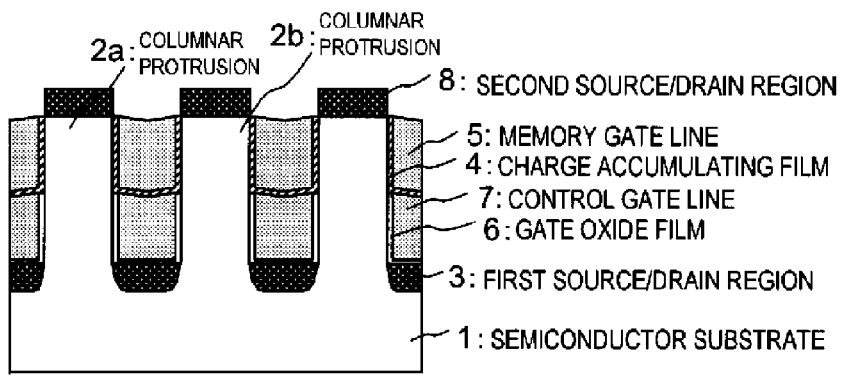

- 2a: COLUMNAR PROTRUSION
- 2b: COLUMNAR PROTRUSION
- 8: SECOND SOURCE/DRAIN REGION
- 5: MEMORY GATE LINE
- 4: CHARGE ACCUMULATING FILM
- 7: CONTROL GATE LINE
- 6: GATE OXIDE FILM
- 3: FIRST SOURCE/DRAIN REGION
- 1: SEMICONDUCTOR SUBSTRATE

NONVOLATILE SEMICONDUCTOR MEMORY DEVICE

CROSS-REFERENCE TO RELATED APPLICATION

This application is based upon and claims the benefit of the priority of Japanese patent application No. 2009-180026 filed on Jul. 31, 2009, the disclosure of which is incorporated herein in its entirety by reference thereto.

TECHNICAL FIELD

The present invention relates to a nonvolatile semiconductor memory device, and in particular, relates to a nonvolatile semiconductor memory device having columnar protrusions formed on a surface of a semiconductor substrate and provided with a split gate in a sidewall of the columnar protrusions.

BACKGROUND

With regard to nonvolatile semiconductor memory devices such as flash memory or the like, memory cells of various structures are being developed in order to have higher integration. In particular, attention is being focused on technology for raising the integration level of the memory cells by having the memory cells in a three-dimensional structure.

Patent Document 1 discloses a nonvolatile semiconductor memory device in which a columnar protrusion is provided on a surface of a semiconductor substrate and a charge accumulating film (or layer) is provided on a sidewall of the columnar protrusion. FIG. 8 shows a cross-sectional view thereof. As shown in FIG. 8, the charge accumulating film 124 is formed on the sidewall of the columnar protrusion 102 provided on the surface of the semiconductor substrate 101, and a control gate 108 is formed so as to sandwich the charge accumulating film 124 with the columnar protrusion 102. The charge accumulating film 124 and the control gate 108 are formed so as to surround at least a part of the periphery of the columnar protrusion. That is, in Patent Document 1, by forming the charge accumulating film 124 and the control gate 108 on the sidewall of the columnar protrusion 102 provided on the surface of the semiconductor substrate 101, it is possible to ensure an adequately large capacity between the charge accumulating film 124 and the control gate 108, with a small occupying area. Furthermore, by a drain 110 being split by a groove, an element separation region can be made smaller. In Patent Document 1, one memory cell is formed for each columnar protrusion 102.

Patent Document 1

JP Patent Kokai Publication No. JP-A-4-79369

SUMMARY

The entire disclosure of the above patent document is incorporated herein by reference thereto. The following analysis is given by the present invention.
In Patent Document 1, a charge accumulating film is formed to be separate for every cell (columnar protrusion). Consequently, forming the charge accumulating film to be separate requires as much space as possible between the cells (columnar protrusions), and there is a limitation to high integration.

According to a first aspect of the present invention there is provided a nonvolatile semiconductor memory device, which includes a first columnar protrusion and a second columnar protrusion formed to be separate on a surface of a semiconductor substrate. The first and the second columnar protrusions each include a split gate nonvolatile memory cell, in which a first and a second of a source/drain pair are respectively formed at a surrounding part and an extremity, and in which a first layered structure, in which a charge accumulating film and a memory gate line are layered, and a second layered structure, in which a gate oxide film and a control gate line are layered, are formed on a surface of a sidewall between the surrounding part and the extremity. The first layered structure is also formed between the first and the second columnar protrusions, whereby the memory gate line of the first columnar protrusion and the second columnar protrusion is connected each other.

According to a second aspect of the present invention there is provided a nonvolatile semiconductor memory device, which includes a plurality of the columnar protrusions formed in a matrix-like manner in a first direction and a second direction intersecting the first direction on a surface of the semiconductor substrate. Each of the columnar protrusions includes a split gate nonvolatile memory cell in which a first source/drain region and a second source/drain region are respectively formed at a surrounding part and an extremity, and in which a first layered structure, in which a charge accumulating film and a memory gate line are layered, and a second layered structure, in which a gate oxide film and a control gate line are layered, are formed on a surface of a sidewall between the surrounding part and the extremity. The first layered structure is also formed between the columnar protrusions in the first direction, whereby the memory gate line is commonly connected between the columnar protrusions in the first direction.

According to a third aspect of the present invention there is provided a method of manufacturing a nonvolatile semiconductor memory device. The method includes: forming a plurality of columnar protrusions on a surface of a semiconductor substrate; forming source/drain regions in respective extremities and surrounding parts of the columnar protrusions; forming a first insulating film on the surface of the semiconductor substrate; and forming a first layer on a surface of the first insulating film. The method further includes etching back the first gate layer and removing an exposed part of the first insulating film so that a first gate in which the first insulating film and a first gate layer are layered on a surface of a sidewall of the columnar protrusions other than a part near the extremities is formed. The method further includes forming a second gate in which a second insulating film and a second gate layer are layered on a surface of the first gate layer and the surface of the semiconductor substrate that is not covered by the first gate layer so that the second insulating film and the second gate layer are layered on the surface of the sidewall including a part close to the extremity that is not covered by the first gate layer. Either one of the first insulating film and the second insulating film is a charge accumulating film.

The meritorious effects of the present invention are summarized as follows.
According to the present invention, since a charge accumulating film of a nonvolatile memory cell is not split for each columnar protrusion, a nonvolatile semiconductor memory device is obtained in which distance between the columnar protrusions is made minute.

Furthermore, a method of manufacturing is obtained for a nonvolatile semiconductor memory device in which a split gate nonvolatile memory cell is formed with high density in the columnar protrusions.

BRIEF DESCRIPTIONS OF THE DRAWINGS

FIG. 2A is a cross-section view in the direction bb' in FIG. 1A, and FIG. 2B is a cross-section view cc' thereof.

FIGS. 6A and 6B are cross-sectional views showing a manufacturing process continuing from FIGS. 5A and 5B.

FIG. 7A is a planar view of a nonvolatile semiconductor memory device according to another example of the present invention, FIG. 7B is a cross-sectional view bb' thereof, and FIG. 7C is a cross-sectional view cc' thereof.

PREFERRED MODES

Figure 1A:
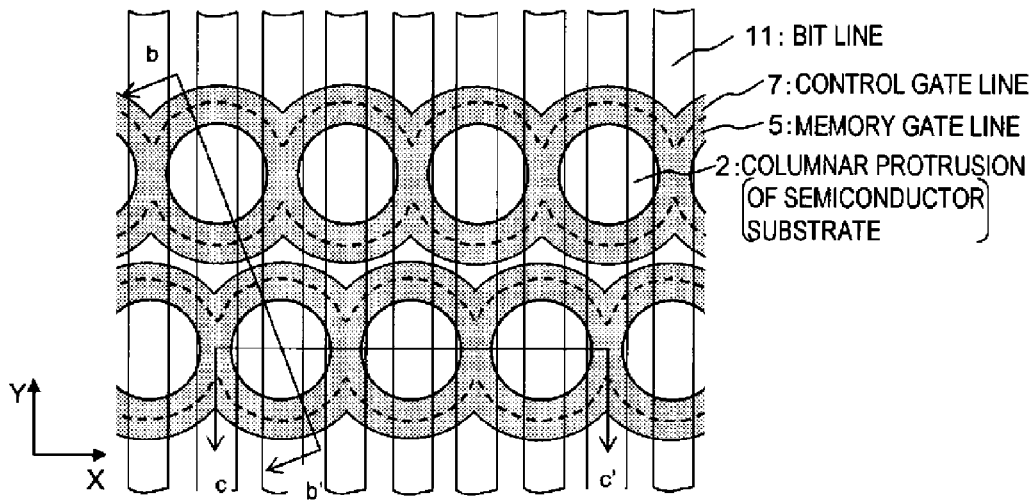
FIG. 1A is a planar view of a nonvolatile semiconductor memory device according to an example of the present invention.

First a description is given concerning an outline of preferred modes of the present invention. Moreover, drawings and reference symbols in the drawings, which are cited in the description of the outline, are shown as an example, and are not intended to limit variations of the preferred modes according to the present invention.

Figure 1B:
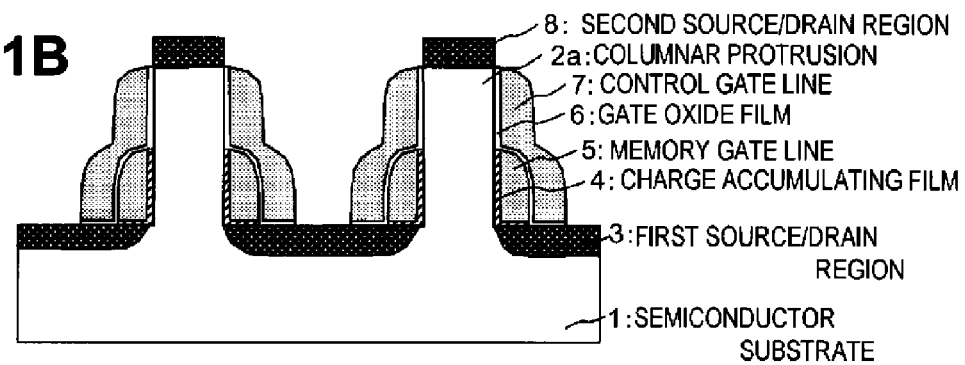
FIG. 1B is a cross-sectional view bb' thereof.
Figure 1C:
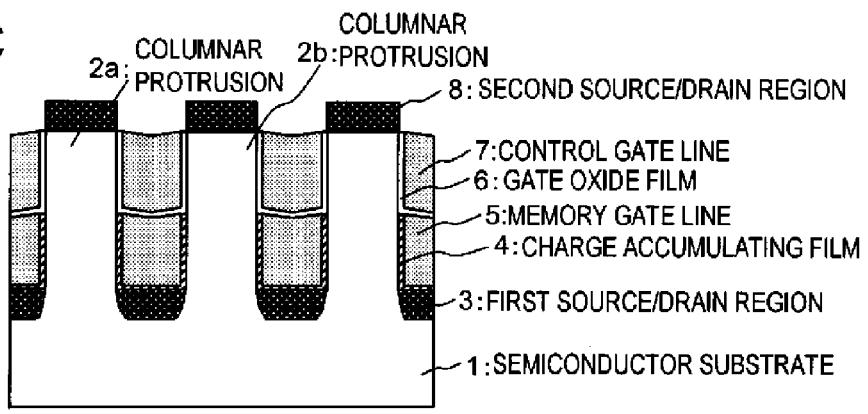
FIG. 1C is a cross-sectional view cc' thereof.

In a nonvolatile semiconductor memory device in an exemplary embodiment of the present invention, as shown in FIG. 1C and FIG. 7C for example, a first columnar protrusion 2a and a second columnar protrusion 2b are formed to be separate on a surface of a semiconductor substrate 1. The first and the second columnar protrusions (2a and 2b) each include a split gate nonvolatile memory cell, in which a first source/drain region 3 and a second source/drain region 8 are formed at a surrounding part and an extremity thereof, and in which a first layered structure, in which a charge accumulating film 4 and a memory gate line 5 are layered, and a second layered structure, in which a gate oxide film 6 and a control gate line 7 are layered, are formed on a surface of a sidewall between the surrounding part 8 and the extremity 3. The first layered structure is also formed between the first and second columnar protrusions (between 2a and 2b), whereby the memory gate line 5 is commonly connected by the first columnar protrusion 2a and the second columnar protrusion 2b. Since the charge accumulating film 4 is not removed between the first columnar protrusion 2a and the second columnar protrusion 2b, this part can be formed to have the columnar protrusions closely packed. In general, the charge accumulating film of the nonvolatile semiconductor memory device may use a floating gate, which is a conductive film, or may use a trap layer (or film), which is an insulating film. According to a finding of the present inventors, if the trap layer is used as the charge accumulating film, since there is no migration of charge between memory cells, there is no necessity to separate the charge accumulating films among the memory cells. Furthermore, in the abovementioned structure, it is possible to insulate the conductive layer (a first source/drain region 3 or the control gate line 7) that is a base, and the memory gate line 5, by the charge accumulating film 4.

Furthermore, as shown in FIG. 6B for example, the first source/drain region 3 provided at the surrounding parts are commonly connected, and the second source/drain region 8 provided at the extremities are respectively connected to separate bit lines 11, at the first and second columnar protrusions. Therefore, by the respective first and the second columnar protrusions, it is possible to store data independently, and to read data independently. Furthermore, as shown in FIGS. 1A-1C and FIGS. 7A-7C for example, second layered structures (6+7) are formed between the first and second columnar protrusions (2a and 2b). Thereby the control gate line 7 of the first columnar protrusion 2a and the second columnar protrusion 2b is connected each other.

Furthermore, as shown in FIGS. 1A-1C and FIGS. 7A-7C for example, a plurality of the columnar protrusions 2 are formed in a matrix-like manner in a first direction (direction of cross-section cc') and a second direction (direction of cross-section bb') intersecting the first direction on a surface of the semiconductor substrate 1, and each of the columnar protrusions 2 includes a split gate nonvolatile memory cell, in which a first source/drain region 3 and a second source/drain region 8 are formed at the surrounding part and the extremity thereof, and in which a first layered structure, in which a charge accumulating film 4 and a memory gate line 5 are layered, and a second layered structure, in which a gate oxide film 6 and a control gate line 7 are layered, are formed on a surface of the sidewall between the surrounding part 3 and the extremity 8. The first layered structure (4+6) is formed also between the columnar protrusions 2 in the first direction (the direction of the cross-section cc'). Thereby the memory gate line 5 of the columnar protrusions 2 in the first direction (the direction of the cross-section cc') is connected each other.

Furthermore, as shown in FIGS. 1A-1C and FIGS. 7A-7C as one example, space between the columnar protrusions formed in the matrix-like manner is larger in the second direction (the direction of the cross-section bb') than in the first direction (the direction of the cross-section cc'). The second layered structure (6+7) is formed to be linked between the columnar protrusions 2 in the first direction (the direction of the cross-section cc') and is separate between the columnar protrusions 2 in the second direction (the direction of the cross-section bb'). Thereby the control gate lines 7 are connected in the first direction (the direction of the cross-section cc'), and are separated in the second direction (the direction of the cross-section bb'). Furthermore, as shown in FIGS. 1A-1C, 6A, 6B and 7A-7C, a plurality of bit lines 11 are formed in a direction (direction of a Y axis) intersecting the first direction (the direction of the cross-section cc'), and the plurality of bit lines 11 are respectively connected to the second source/drain region 8 provided at the extremities of the columnar protrusions 2. Moreover, the first source/drain region formed at the surrounding parts is commonly connected by the surrounding parts 3 of each of the columnar protrusions 2.

In addition, as shown in FIGS. 1A-1C as one example, the first layered structure (4+5) is formed on a bottom face of the semiconductor substrate 1 between the columnar protrusions in the first direction (the direction of the cross-section cc') and the surface of, on sidewalls of the columnar protrusions 2, a sidewall close to the bottom, and the second layered structure (6+7) is formed on the surface of the first layered structure (4+5) and the surface of, on the sidewall of the columnar protrusions 2, a sidewall close to the extremity that is not covered by the first layered structure (4+5).

In addition, as shown in FIGS. 7A-7C as one example, the second layered structure (6+7) is formed on the bottom face of the semiconductor substrate 1 between the columnar protrusions 2 in the first direction (the direction of the cross-section cc') and the surface of, on the sidewall of the columnar protrusions 2, a sidewall close to the bottom; and the first layered structure (4+5) is formed on the surface of the second layered structure (6+7) and the surface of, on the sidewall of the columnar protrusion 2, a sidewall close to the extremity that is not covered by the second layered structure (6+7). In addition, the first layered structure (4+5) is also formed on the surface of the semiconductor substrate 1 that is not covered by the second layered structure (6+7) between the columnar protrusions 2 in the second direction (the direction of the cross-section bb'); and in this way, the memory gate line 5 is commonly connected between the columnar protrusions 2 in the second direction (the direction of the cross-section bb'). According to abovementioned configuration, since separation of the charge accumulating film 4 and the memory gate line 5 does not take place in the second direction (the direction of the cross-section bb'), the distance between the columnar protrusions 2 in the second direction (the direction of the cross-section bb') can be reduced.

Furthermore the charge accumulating film 4 is an insulating film internally including the trap layer. In addition, the abovementioned nonvolatile semiconductor memory device is a flash memory in which data can be erased in block units.

Figure 2A:
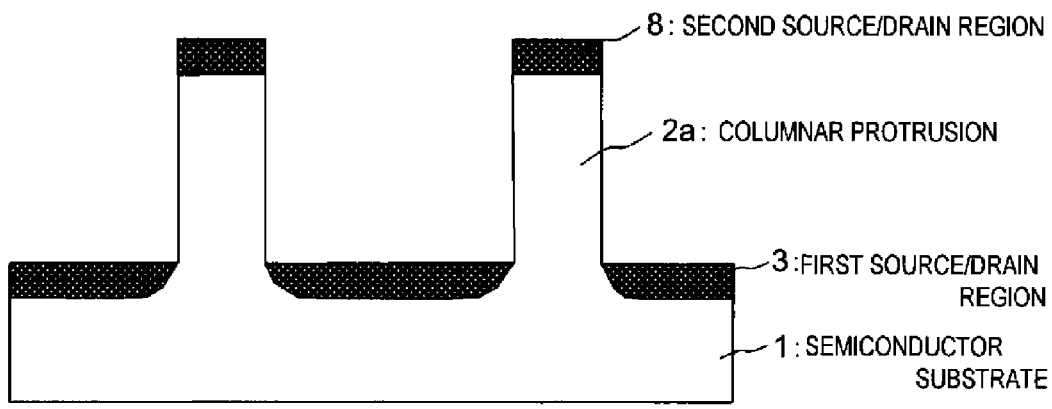
FIGS. 2A and 2B are cross-sectional views showing a manufacturing process for the nonvolatile semiconductor memory device in an example.
Figure 2B:
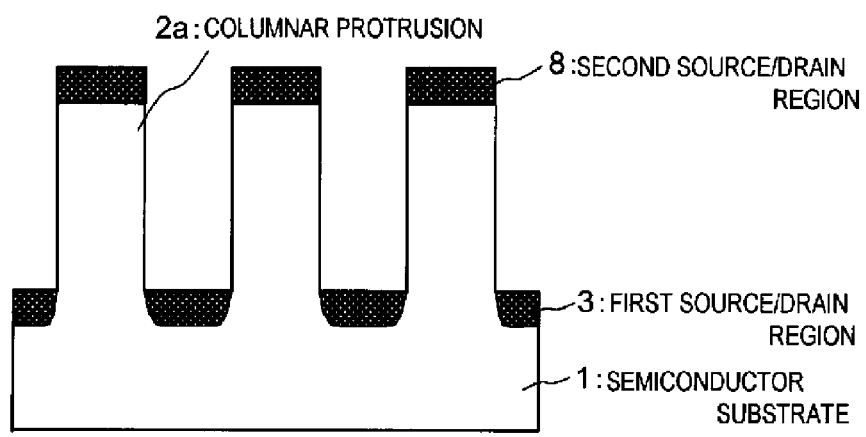

Furthermore, a method of manufacturing the nonvolatile semiconductor memory device in one exemplary embodiment of the present invention, as shown in FIGS. 2A and 2B to FIGS. 6A and 6B as an example, includes: forming a plurality of columnar protrusions 2 on the surface of the semiconductor substrate 1, and forming respective source/drain regions at the extremity 8 and the surrounding part 3 of the columnar protrusions 2 (FIGS. 2A and 2B). The method further includes forming a first insulating film on the surface of the semiconductor substrate and forming a first gate layer on the surface of the first insulating film (FIGS. 3A and 3B). The method further includes etching back the first gate layer and removing an exposed part of the first insulating film. Then a first gate in which the first insulating film and the first gate layer are layered on a surface of a sidewall of the columnar protrusions 2 other than a part near the extremity (FIGS. 4A and 4B). The method further includes forming a second gate in which a second insulating film and a second gate layer are layered on the surface of the first gate layer and the surface of the semiconductor substrate 1 that is not covered by the first gate layer. Then the second insulating film and the second gate layer are layered on the surface of the sidewall including a part close to the extremity that is not covered by the first gate layer (FIGS. 5A and 5B). Either one of the first insulating film and the second insulating film is the charge accumulating film 4. As in FIGS. 2A and 2B to FIGS. 6A and 6B, with the first insulating film as the charge accumulating film 4, the charge accumulating film 4 and the memory gate line 5 may be formed before the gate oxide film 6 and the control gate line 7, and as in FIGS. 7A-7C, with the second insulating film as the charge accumulating film 4, the charge accumulating film 4 and the memory gate line 5 may be formed after the gate oxide film 6 and the control gate line 7.

Furthermore, in forming a plurality of columnar protrusions 2, the forming the plural columnar protrusions 2 may include forming on the surface of the semiconductor substrate 1 in a matrix-like manner, in the first direction (the direction of the cross-section cc' of FIG. 1A and FIG. 7A) and the second direction (the direction of the cross-section bb') that intersects the first direction, spaced out more than the first direction (the direction of the cross-section cc'). The etching back may include etching back so as to leave, on a bottom face of the semiconductor substrate 1 between the plurality of columnar protrusions 2, a first gate layer formed between the columnar protrusions 2 in the first direction (the direction of the cross-section cc'), and to remove the first gate layer formed between the columnar protrusions 2 in the second direction, whereby first gates formed in the respective columnar protrusions 2 are connected in the first direction and are formed to be separate in the second direction. When forming the second gate is performed, at least second gates that are adjacent in the first direction are formed to be commonly connected by the second gate layer. That is, since at least the charge accumulating film 4 between the columnar protrusions 2 in the first direction (the direction of the cross-section cc') is not separated, a layout is possible in which at least the columnar protrusions 2 are disposed to be adjoining in the first direction.

Figure 4A:
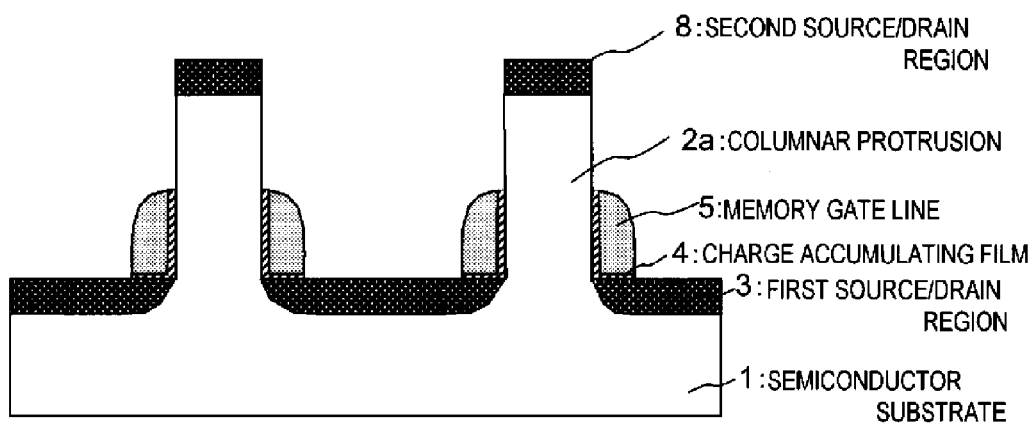
FIGS. 4A and 4B are cross-sectional views showing a manufacturing process continuing from FIGS. 3A and 3B.
Figure 4B:
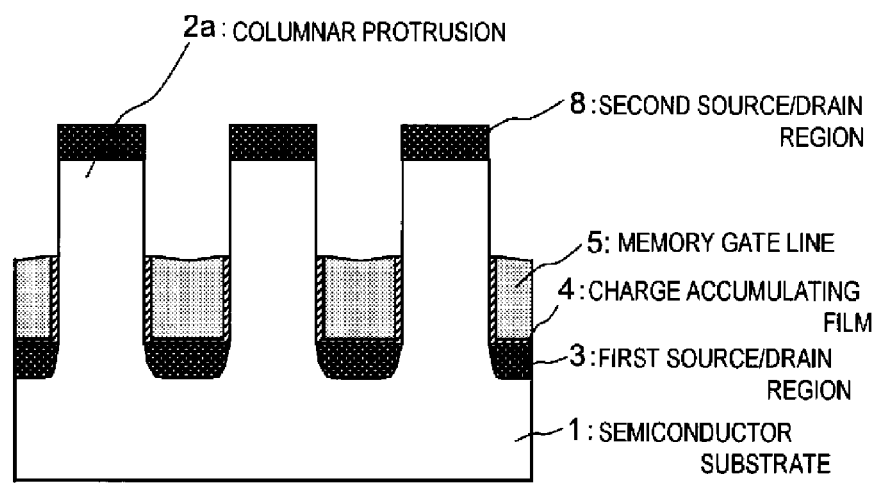

Furthermore, forming the first gate shown in FIG. 4A may include etching the first gate layer exposed by dry etching, and removing the first insulating film exposed by the etching. Moreover, as an example, as shown in FIG. 6A, FIG. 6B, FIG. 1A, and FIG. 7A, a process is included of wiring a plurality of bit lines 11 connected to a source/drain region 8 at the extremity of each of the columnar protrusions 2 in a direction (a Y axis direction in FIG. 1A and FIG. 7A) intersecting the first direction (the direction of the cross-section cc'). Examples of the preferred modes will now be described in detail with reference to the drawings.

FIRST EXAMPLE

Configuration of First Example

FIG. 1A is a planar view showing a memory cell portion of a nonvolatile semiconductor memory device of a first example. Furthermore, FIG. 1B and FIG. 1C are, respectively, a cross-section bb' and a cross-section cc'. A plurality of columnar protrusions 2 are formed in a matrix-like manner in a direction of the cross-section cc' and a direction of the cross-section bb' on the semiconductor substrate 1. The direction of the cross-section bb' and the direction of the cross-section cc' need not necessarily be orthogonal, as shown in FIG. 1A, but may be orthogonal. With regard to distance between the columnar protrusions 2, the distance in the direction of the cross-section cc' is smaller than the distance in the direction of the cross-section bb'. In FIGS. 1A-1C, the columnar protrusions 2 are protrusions of a columnar shape, but may also be protrusions of a prismatic shape.

A first source/drain region 3 is formed on a surface of the semiconductor substrate 1 surrounding the columnar protrusions 2, and a second source/drain region 8 is formed at an extremity portion of the columnar protrusions 2. One of the first source/drain region 3 and the second source/drain region 8 is a source and the other is a drain according to voltage of each, and a gate of a nonvolatile memory cell is formed between the drain and the source. As shown in FIG. 1B, a memory gate line 5 of sidewall form in a sidewall of the columnar protrusion is provided, sandwiching a charge accumulating film 4 with a surface of the columnar protrusion 2. The charge accumulating film 4 is an insulating film having a trap layer such as an ONO film or the like.

The memory gate line 5 of sidewall form is formed to surround and cover a portion of the sidewall of the columnar protrusion 2 towards the bottom close to the first source/drain region 3, and, in the sidewall of the columnar protrusion 2, is not formed on the sidewall close to the extremity at which the second source/drain region 8 is formed. Around the columnar protrusion 2, a layered structure of a gate oxide film 6 and a control gate line 7 in sidewall form are additionally formed from an outer side of the memory gate line 5. By this layered structure of the gate oxide film 6 and the control gate line 7, a portion of the sidewall close to the extremity that is not covered by the memory gate line 5, is covered.

In addition, the second source/drain region 8 formed at the extremity of each columnar protrusion 2 is connected to a bit line 11 provided in a layer higher than the extremity of each columnar protrusion 2 (See FIG. 1A; in FIG. 1B and FIG. 1C representation of the bit line is omitted). The bit lines 11 are wired in a direction intersecting the direction of the cross-section cc' (in FIG. 1A, the direction of the Y axis orthogonal to the direction of the cross-section cc'), and different bit lines 11 are respectively connected to the second source/drain region 8 of the columnar protrusions 2 lined up in the direction of the cross-section cc'. In FIG. 1A, the direction of the cross-section bb' and the direction of the wiring of the bit lines 11 does not match, but these direction may match. As in FIG. 1A, by making the bit lines 11 orthogonal to the direction of the cross-section cc', and shifting the direction of the cross-section bb' with respect to the bit lines 11 and wiring direction, a layout is possible in which the number of bit lines 11 is increased and memory cells are more closely packed.

For each of the abovementioned columnar protrusions 2, a split gate nonvolatile memory cell is formed by the first source/drain region 3, the memory gate line 5, the charge accumulating film 4, the control gate line 7, the gate oxide film 6, and the second source/drain region 8 connected to the bit line 11. At the first source/drain region 3 provided on the bottom face of the semiconductor substrate 1, a common potential is supplied in each memory cell.

Furthermore, in the cross-section bb' in FIG. 1B, since to some extent there is a distance between the columnar protrusions 2, the layered structure of the charge accumulating film 4 and the memory gate line 5 in a sidewall form, and the layered structure of the gate oxide film 6 and the control gate line 7 are formed to be separate between the columnar protrusions 2, but in the cross-section cc' shown in FIG. 1C since the distance between the columnar protrusions 2 is small, space between the columnar protrusions 2 is filled by the layered structure of the charge accumulating film 4 and the memory gate line 5, and the layered structure of the gate oxide film 6 and the control gate line 7, and space between the columnar protrusions 2 disposed in the direction of the cross-section cc' the layered structure of the charge accumulating film 4 and the memory gate line 5, and the layered structure of the gate oxide film 6 and the control gate line 7 are formed to be joined. Therefore, each memory cell in the direction of the cross-section cc' is connected by the common memory gate lines 5 and the control gate lines 7. Furthermore, since the charge accumulating film 4 is an insulating film, and charge trapped in the charge accumulating film 4 does not migrate within the charge accumulating film 4, there is no problem with the charge accumulating film 4 of the respective memory cells being joined. In the first example, the charge accumulating film 4 is provided on the surface of the first source/drain region 3 provided on the bottom face of the semiconductor substrate 1, and the memory gate line 5 is additionally formed on that surface, but since the charge accumulating film 4 is an insulating film, insulation is possible by the charge accumulating film 4 provided between the first source/drain region 3 and the memory gate line 5.

In particular, in the direction of the cross-section cc', since there is no necessity to form the charge accumulating film 4 to be separate for each memory cell, it is possible to shorten the distance between the columnar protrusions 2 and to increase level of integration.

Operation of First Example

Next, a description is given concerning operation of the nonvolatile semiconductor memory device of the first example. Selection of a memory cell is performed by selecting the memory gate line 5, the control gate line 7, and the bit line 11 of FIGS. 1A-1C. When writing, a positive voltage (for example, 4.5 V) is applied to the first source/drain region 3, and a positive voltage (for example, 5.5 V) is applied to the memory gate line 5; a positive voltage lower than the memory gate line 5 is applied to the control gate line 7, and the second source/drain region 8 is grounded to 0 V. At this time, some electrons flowing from the second source/drain region 8 to the first source/drain region 3 are accelerated in a channel in a lower part of the memory gate line 5 and some are injected into the charge accumulating film 4 that is the trip film below the memory gate line 5, to perform writing. At this time, with regard to a memory cell, connected to the common memory gate line 5 and the control gate line 7, and in which writing is not carried out, a positive voltage (for example, 1.8 V) from the bit line 11 is applied to the second source/drain region 8, and writing is prevented.

At a time of erasure, a positive voltage (for example, 4.5 V) is applied to the first source/drain region 3, and a negative voltage (for example, −3.0 V) is applied to the memory gate line 5. At this time, electron hole pairs are generated by an interband tunnel within the first source/drain region 3 under the memory gate line 5, and some of these holes are accelerated by an electrical field of the first source/drain region 3 and are injected into the charge accumulating film 4 to perform erasure. A voltage of 0 V or a negative voltage (approximately 0 to −3 V) is given to the control gate line 7, and the second source/drain region 8 is grounded to 0 V. The erasure is performed by erasing all cells all together.

At a time of reading, the first source/drain region 3 is grounded, a positive voltage (for example, 2 V) is applied to the memory gate line 5, a positive voltage (for example, 1 V) is applied to the second source/drain region 8, and a positive voltage (for example 2 V) is given to the control gate line 7, so that a current flows between source and drain. At this time, using the fact that in a state (write state) in which electrons are acculated in the charge accumulating film 4 (trap film), the current is small, and in a state (erase state) in which the holes are accumulated or electrons are hardly accumulated the current is large, data accumulated in the memory cell is read.

Manufacturing Method of First Example

Next, a description is given concerning a method of manufacturing the nonvolatile semiconductor memory device of the abovementioned first example, making reference to FIGS. 2A and 2B to FIGS. 6A and 6B. In respective manufacturing processes of FIGS. 2A and 2B to FIGS. 6A and 6B, FIG. 2A to FIG. 6A refer to the cross-section in the direction bb' in FIG. 1A, and FIG. 2B to FIG. 6B refer to the cross-section in the direction cc' in FIG. 1A.

Initially a resist pattern is formed on the silicon semiconductor substrate 1; outside of the columnar protrusions 2 part, a groove is dug in a vertical form by dry etching; and the columnar protrusions 2 are formed on the surface of the semiconductor substrate 1. Here, a plurality of the columnar protrusions 2 are formed in a matrix shape, in the direction of the cross-section cc' and the direction of the cross-section bb' shown in FIG. 1A. The space between the columnar protrusions 2 in the direction of the cross-section cc' is smaller than the space between the columnar protrusions 2 in the direction of the cross-section bb'. Next, ion implantation is performed by ion implantation equipment, and source/drain regions are formed on each surface of the extremity 8 of the columnar protrusions 2 and the bottom 3 surrounding the columnar protrusions 2 of the semiconductor substrate 1 on which the columnar protrusions 2 are provided (FIGS. 2A and 2B). With regard to the source/drain regions (3 and 8), after the nonvolatile memory cells are formed at the columnar protrusions 2, one thereof functions as a source, and the other functions as a drain. Which of the extremity 8 and the surrounding part 3 forms the source and which forms the drain is changed by a writing/reading operation mode.

Figure 3A:
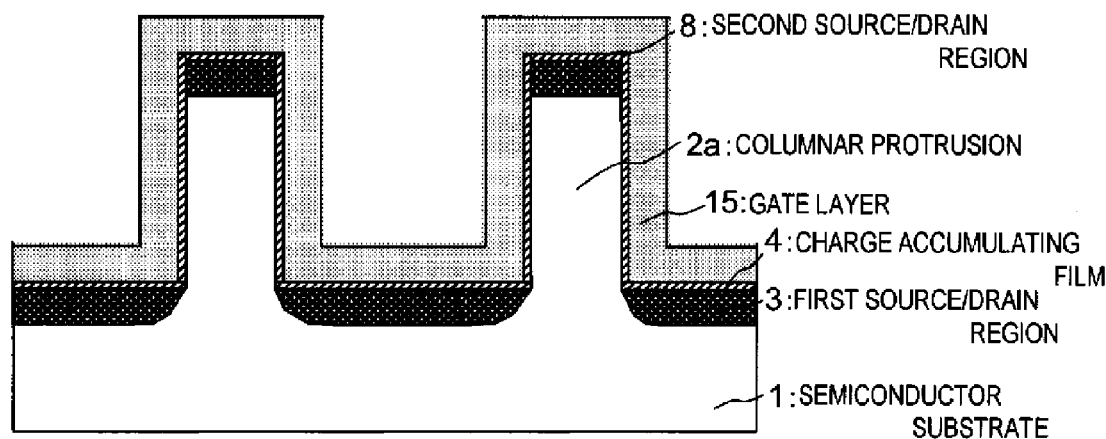
FIGS. 3A and 3B are cross-sectional views showing a manufacturing process continuing from FIGS. 2A and 2B.
Figure 3B:
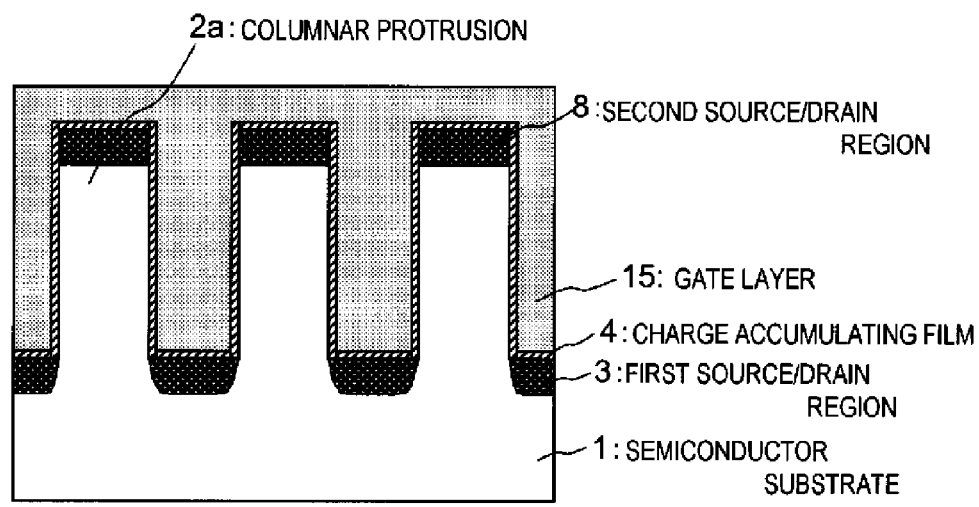

Thereafter, the charge accumulating film 4 forming the trap layer and polysilicon (gate layer 15) are grown by a CVD method on the surface of the semiconductor substrate 1 on which the columnar protrusions 2 are formed (FIGS. 3A and 3B). The charge accumulating film 4 may, for example, be an ONO film (a layered film of a silicon oxide film, a silicon nitride film and a silicon oxide film). In the cross-section bb' with a large space between the columnar protrusions 2 as shown in FIG. 3A, recesses and protrusions can be made following the columnar protrusions 2, but in the cross-section cc' with a small space between the columnar protrusions 2 as shown in FIG. 3B, recesses between the columnar protrusions 2 are practically filled by polysilicon (gate layer 15).

Furthermore, with dry etching, the polysilicon (the gate layer 15) undergoes etching from the top, and the memory gate line 5 is formed. In this etching, the gate layer 15 at the extremities of the columnar protrusions 2 is completely removed, and an etching back process is performed until the charge accumulating film 4 at the extremity of the columnar protrusions 2 is exposed. By this etching, the polysilicon (the gate layer 15) is completely removed, similar to the extremity of the columnar protrusions 2, between the columnar protrusions 2 in the direction of the cross-section bb' shown in FIG. 3A, in which the space between the columnar protrusions 2 is large, and the surface of the charge accumulating film 4 is exposed. On the other hand, upper layer polysilicon is removed between the columnar protrusions 2 in the direction of the cross-section cc', in which the space is small as shown in FIG. 3B, but lower layer polysilicon remains, and the surface of the charge accumulating film 4 is not exposed. Thereafter, the charge accumulating film 4 (trap film) whose surface is exposed is removed by wet etching, and in the cross-section bb' shown in FIG. 4A, a layered structure of the charge accumulating film 4 and the memory gate line 5 is formed on a sidewall of a part close to the bottom of the semiconductor substrate 1, excepting the extremity of the columnar protrusions 2. Between the columnar protrusions 2, the bottom face of the semiconductor substrate 1 is exposed. In the cross-section cc' shown in FIG. 4B, the layered structure of the charge accumulating film 4 and the memory gate line 5 remains in a lower layer portion between the columnar protrusions 2, and the bottom of the semiconductor substrate 1 is not exposed.

Figure 5A:
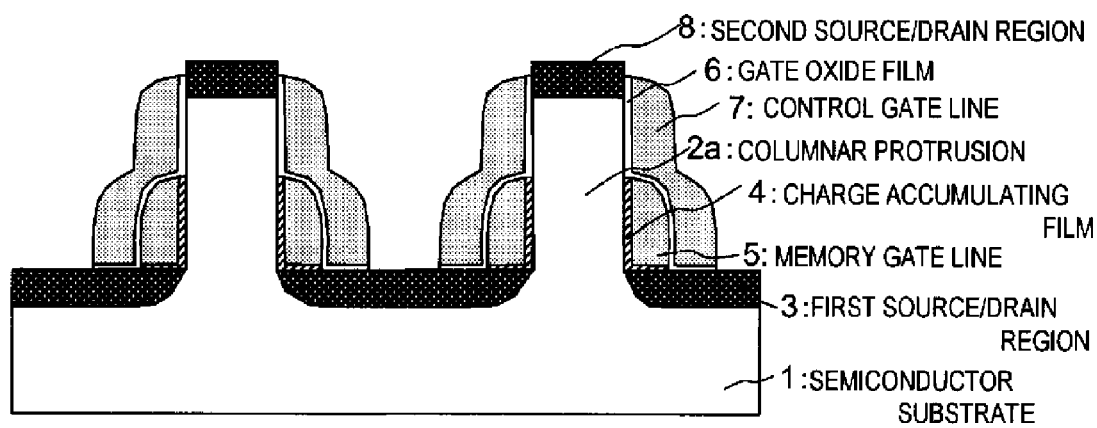
FIGS. 5A and 5B are cross-sectional views showing a manufacturing process continuing from FIGS. 4A and 4B.
Figure 5B:
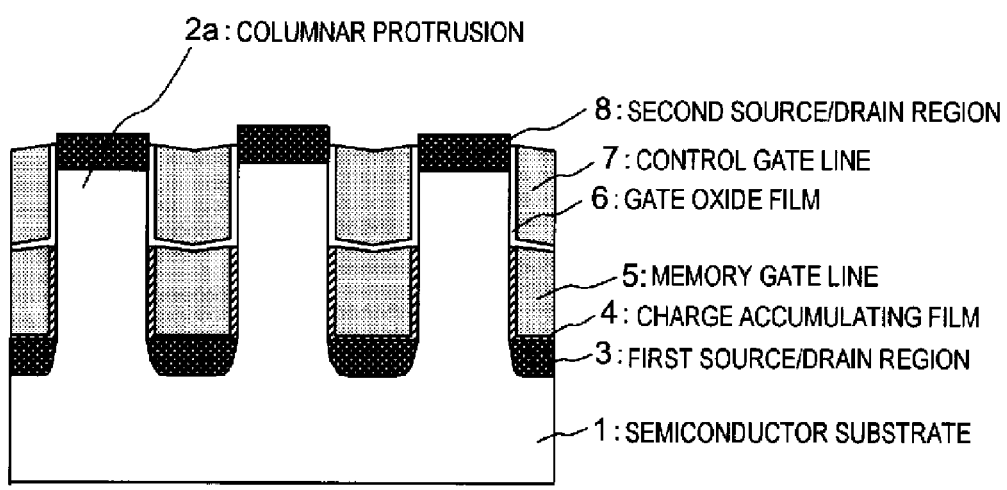
Figure 8:
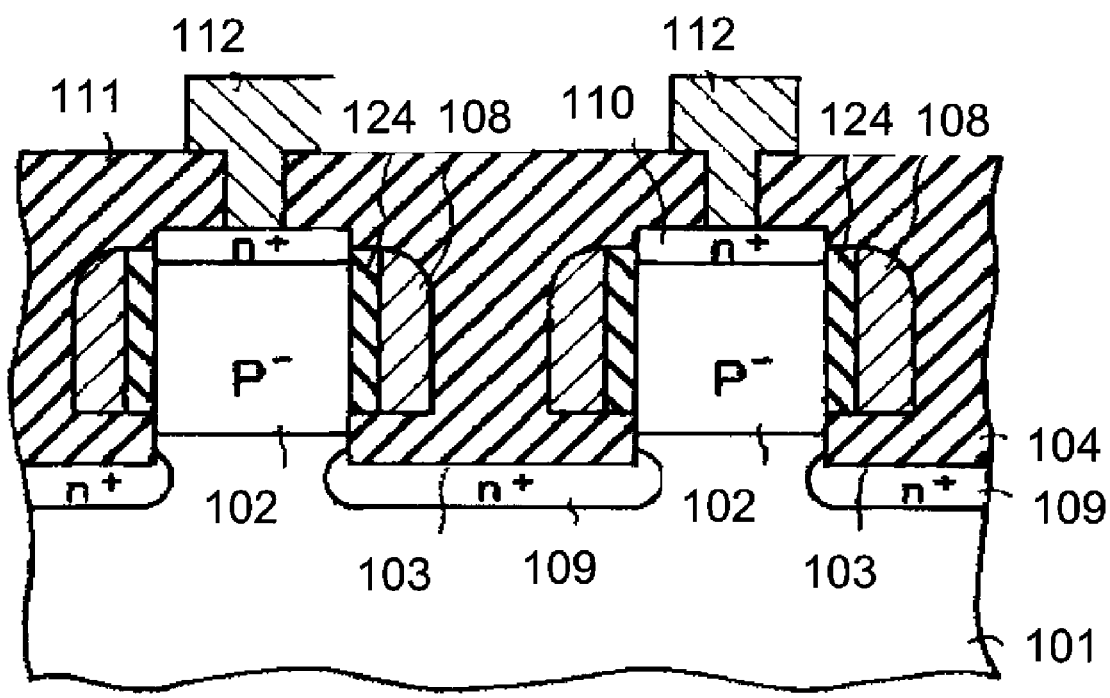
FIG. 8 is a cross-sectional view of a conventional nonvolatile semiconductor memory device described in Patent Document 1.

In addition, in the CVD method, the gate oxide film 6 is grown in a portion where the surface of the memory gate line 5 and the semiconductor substrate 1 are exposed, and thereon, the polysilicon is grown. Thereafter, the control gate line 7 is formed by dry etching the polysilicon similar to the memory gate line 5, and the gate oxide film 6 whose surface is exposed is removed by wet etching. As a result, in the cross-section bb' in which the distance between the columnar protrusions 2 is large as shown in FIG. 5A, the bottom face of the semiconductor substrate 1 is exposed, but in the cross-section cc' in which the distance between the columnar protrusions 2 is small as shown in FIG. 5B, the control gate line 7 remains between the columnar protrusions 2, and a layer lower than the control gate line 7 is not exposed.

Next, an interlayer insulating film 9 is formed at the first source/drain region 3 and the second source/drain region 8 exposed by an oxide film such as a PSG film or the like, a contact 10 reaching the second source/drain region 8 from a top layer of the interlayer insulating film 9 is formed, a bit line 11 is formed on the interlayer insulating film 9 and the contact 10, electrodes are connected, and the nonvolatile semiconductor memory device of the first example is completed.

SECOND EXAMPLE

Configuration of Second Example

FIG. 7A is a planar view of a memory cell portion of the nonvolatile semiconductor memory device of a second example. Furthermore, FIG. 7B and FIG. 7C are respectively a cross-sectional drawing at bb' and a cross-sectional drawing at cc' in FIG. 7A. In the second example, portions that are identical to the configuration, operation, and method of manufacturing of the first example are given identical reference symbols, and detailed descriptions are omitted. In the first example, the first layered structure is provided, in which the charge accumulating film 4 and the memory gate line 5 are layered on the bottom side (surrounding the columnar protrusions 2) of the semiconductor substrate 1 on the columnar protrusion 2 sidewalls, and from this first layered structure a second layered structure is provided, in which the gate oxide film 6 and the control gate line 7 are layered towards the extremity of the columnar protrusions 2. In the second example, the sequence of the first layered structure and the second layered structure is reversed; in the sidewall of the columnar protrusions 2 the second layered structure of the oxide film 6 and the control gate line 7 is provided on the sidewall towards the bottom of the semiconductor substrate 1; and from the second layered structure the first layered structure is provided, in which the charge accumulating film 4 and the memory gate line 5 are layered on the sidewall towards the extremity of the columnar protrusions 2. However, in both the examples, there is no change regarding forming a split gate nonvolatile memory cell, in which a first source/drain region 3 and a second source/drain region 8 are provided at a surrounding and an extremity part of the columnar protrusions 2, and by the first layered structure and the second layered structure on the sidewall between the first and second source/drain regions, a memory gate line 5 and a control gate line 7 are provided. Only the sequence of providing the memory gate line 5 and the control gate line 7 between the surrounding part and the extremity is different.

Furthermore, in the first example, as shown in FIG. 1B, among the columnar protrusions 2 provided in matrix form, the charge accumulating film 4 and the memory gate line 5 are not joined between the columnar protrusions 2 provided in the direction of the cross-section bb', and memory gate lines 5 are formed separately. However, in the second example, as shown in FIG. 7B, the charge accumulating film 4 and the memory gate line 5 are joined in the direction of the cross-section bb', and common memory gate lines 5 are connected. Furthermore, since the charge accumulating film 4 is formed on the lower first source/drain region 3, the first source/drain region and the memory gate line 5 are insulated, by the charge accumulating film 4. As a result, it is possible to have the space between the columnar protrusions 2 even smaller than in the first example. That is, by making the memory gate lines 5 common also in the direction of the bit lines 11, it is possible to make the layout area of the memory cell smaller. There may be 2 of the common memory gate lines 5, or there may be 3 or more of the memory gate lines in common.

Operation of Second Example

With regard to a memory cell that is a target for writing and reading, operation of the cell is the same as for the first example, but as a strategy for writing errors to a cell connected to a memory gate line 5 or bit line 11 common to a cell that is a target for writing, the control gate voltage at a time of writing is given a negative potential (for example, −1 V).

Manufacturing Method of Second Example

In the method of manufacturing for the second example, the gate oxide film 6 is grown instead of the charge accumulating film 4, in a manufacturing process of FIGS. 3A and 3B. Therefore, by an etch back process in the manufacturing process of FIGS. 4A and 4B, in contrast to first forming a layered structure of the charge accumulating film 4 and the memory gate line 5 of the first example, a layered structure of the gate oxide film 6 and the control gate line 7 is formed on the semiconductor substrate 1. Similar to the first example, between the columnar protrusions 2 in the cross-section bb', the control gate line 7 and the gate oxide film 6 are completely removed by etch back, and the bottom face of the semiconductor substrate 1 is exposed. Continuing, the memory gate line 5 and the charge accumulating film 4, such as an ONO film or the like, are grown, by a CVD method, on the semiconductor substrate 1 in which the surface and top of the control gate line 7 are exposed. Furthermore, etching is performed from an upper surface of the semiconductor substrate 1 until the extremity of the columnar protrusions 2 is exposed by dry etching. At this time, since the space between the columnar protrusions 2 in the direction of the cross-section bb' is smaller than in the first example, the memory gate line 5 between the columnar protrusions 2 is not completely removed by the abovementioned dry etching, and remains on the surface. Thus, a nonvolatile memory cell configuration described in FIGS. 7A-7C is obtained. Furthermore, thereafter an interlayer insulating film 9 is formed similarly to the first example, and additionally a contact 10 from the top of the interlayer insulating film 9 to a second source/drain region 8 is provided, the bit lines 11 are connected, and the nonvolatile semiconductor memory device of the second example is completed.

Descriptions have been given above according to the examples and the exemplary embodiments, but the present invention is not limited to only configurations of the abovementioned examples and exemplary embodiments, and clearly includes every type of transformation and modification that a person skilled in the art can realize within the scope of the present invention.

What is claimed is:

1. A nonvolatile semiconductor memory device, comprising:
a first columnar protrusion and a second columnar protrusion formed to be separate on a surface of a semiconductor substrate, wherein
said first and second columnar protrusions each include a split gate nonvolatile memory cell in which a first source/drain region and a second source/drain region are respectively formed at a surrounding part and an extremity, and in which a first layered structure, in which a charge accumulating film and a memory gate line are layered, and a second layered structure, in which a gate oxide film and a control gate line are layered, are formed on a surface of a sidewall between said surrounding part and said extremity, and
said first layered structure is also formed between said first and said second columnar protrusions, whereby said memory gate line of said first columnar protrusion and said second columnar protrusion is connected each other.

2. The nonvolatile semiconductor memory device according to claim 1, wherein, at said first and second columnar protrusions, said first source/drain region provided at said surrounding part is connected each other, and each of said second source/drain regions provided at said extremity is connected to a separate bit line.

3. The nonvolatile semiconductor memory device according to claim 1, wherein said second layered structure is also formed between said first and second columnar protrusions, whereby said control gate line of said first columnar protrusion and said second columnar protrusion is connected each other.

4. The nonvolatile semiconductor memory device according to claim 1, wherein said charge accumulating film is an insulating film internally including a trap layer.

5. The nonvolatile semiconductor memory device according to claim 1, wherein said nonvolatile semiconductor memory device is flash memory in which data can be erased in block units.

6. A nonvolatile semiconductor memory device, comprising:
a plurality of columnar protrusions formed in a matrix-like manner in a first direction and a second direction intersecting said first direction on a surface of a semiconductor substrate, wherein
each of said columnar protrusions includes a split gate nonvolatile memory cell in which a first source/drain region and a second source/drain region are respectively formed at a surrounding part and an extremity, and in which a first layered structure, in which a charge accumulating film and a memory gate line are layered, and a second layered structure, in which a gate oxide film and a control gate line are layered, are formed on a surface of a sidewall between said surrounding part and said extremity;
said first layered structure is also formed between said columnar protrusions in said first direction, whereby said memory gate line of said columnar protrusions in said first direction is connected each other.

7. The nonvolatile semiconductor memory device according to claim 6, wherein
space between said columnar protrusions formed in said matrix-like manner is larger in said second direction than in said first direction; and
said second layered structure is formed to be linked between said columnar protrusions in said first direction and is separated between said columnar protrusions in said second direction, whereby said control gate lines of said plurality of columnar protrusions are connected in said first direction and are separated in said second direction.

8. The nonvolatile semiconductor memory device according to claim 6, wherein a plurality of bit lines are formed in a direction intersecting said first direction, and said plurality of bit lines are each connected to a second source/drain region provided at an extremity of said columnar protrusions.

9. The nonvolatile semiconductor memory device according to claim 6, wherein said first source/drain region formed at said surrounding part is commonly connected by the surrounding parts of each of said columnar protrusions.

10. The nonvolatile semiconductor memory device according to claim 6, wherein
said first layered structure is formed on a bottom face of said semiconductor substrate between columnar protrusions in a first direction, and, with regard to a sidewall of said columnar protrusions, on a sidewall surface towards said bottom, and
said second layered structure is formed on a surface of said first layered structure and, with regard to a sidewall of said columnar protrusions, on a sidewall surface towards an extremity not covered by said first layered structure.

11. The nonvolatile semiconductor memory device according to claim 6, wherein
said second layered structure is formed on a bottom face of said semiconductor substrate between columnar protrusions in a first direction, and, with regard to a sidewall of said columnar protrusions, on a sidewall surface towards said bottom, and
said first layered structure is formed on a surface of said second layered structure and, with regard to a sidewall of said columnar protrusions, on a sidewall surface towards an extremity not covered by said second layered structure.

12. The nonvolatile semiconductor memory device according to claim 11, wherein said first layered structure is also formed on said bottom face of said semiconductor substrate not covered by said second layered structure between columnar protrusions in said second direction, whereby said memory gate line is commonly connected also between said columnar protrusions in said second direction.

13. The nonvolatile semiconductor memory device according to claim 6, wherein said charge accumulating film is an insulating film internally including a trap layer.

14. The nonvolatile semiconductor memory device according to claim 6, wherein said nonvolatile semiconductor memory device is flash memory in which data can be erased in block units.

* * * * *